(12) United States Patent
Chen et al.

(10) Patent No.: US 9,330,990 B2
(45) Date of Patent: May 3, 2016

(54) METHOD OF ENDPOINT DETECTION OF PLASMA ETCHING PROCESS USING MULTIVARIATE ANALYSIS

(71) Applicant: TOKYO ELECTRON LIMITED, Tokyo (JP)

(72) Inventors: Yan Chen, Santa Clara, CA (US); Serguei Komarov, Sunnyvale, CA (US); Vi Vuong, Fremont, CA (US)

(73) Assignee: Tokyo Electron Limited, Tokyo (JP)

( * ) Notice: Subject to any disclaimer, the term of this patent is extended or adjusted under 35 U.S.C. 154(b) by 23 days.

(21) Appl. No.: 14/056,059

(22) Filed: Oct. 17, 2013

(65) Prior Publication Data

US 2014/0106477 A1  Apr. 17, 2014

Related U.S. Application Data

(60) Provisional application No. 61/715,047, filed on Oct. 17, 2012.

(51) Int. Cl.
| | |
|---|---|
| *G01L 21/30* | (2006.01) |
| *G01R 31/00* | (2006.01) |
| *H01L 21/66* | (2006.01) |
| *H01J 37/32* | (2006.01) |
| *G06F 17/16* | (2006.01) |
| *H01L 21/67* | (2006.01) |

(52) U.S. Cl.
CPC ............. *H01L 22/26* (2013.01); *G06F 17/16* (2013.01); *H01J 37/32963* (2013.01); *H01L 21/67069* (2013.01)

(58) Field of Classification Search
USPC ........................................................ 216/60
See application file for complete search history.

(56) References Cited

U.S. PATENT DOCUMENTS

| | | |
|---|---|---|
| 3,059,611 A | 10/1962 | Fury |
| 3,612,692 A | 10/1971 | Kruppa |

(Continued)

FOREIGN PATENT DOCUMENTS

EP    0652415 A1    10/1994

OTHER PUBLICATIONS

Yue, Qin, Wiseman, Toprac, "Plasma etching endpoint detection using multiple wavelengths for small open-area wafers", J. Vac. Sci. Technol., A 19, 66 (2001).

(Continued)

*Primary Examiner* — Thomas Pham

(57) ABSTRACT

Disclosed is a method for determining an endpoint of an etch process using optical emission spectroscopy (OES) data as an input. Optical emission spectroscopy (OES) data are acquired by a spectrometer attached to a plasma etch processing tool. The acquired time-evolving spectral data are first filtered and demeaned, and thereafter transformed into transformed spectral data, or trends, using multivariate analysis such as principal components analysis, in which previously calculated principal component weights are used to accomplish the transform. A functional form incorporating multiple trends may be used to more precisely determine the endpoint of an etch process. A method for calculating principal component weights prior to actual etching, based on OES data collected from previous etch processing, is disclosed, which method facilitates rapid calculation of trends and functional forms involving multiple trends, for efficient and accurate in-line determination of etch process endpoint.

10 Claims, 5 Drawing Sheets

(56) References Cited

U.S. PATENT DOCUMENTS

| | | | |
|---|---|---|---|
| 4,147,435 A | 4/1979 | Habegger | |
| 6,582,618 B1* | 6/2003 | Toprac | C07K 14/195 216/59 |
| 7,328,126 B2 | 2/2008 | Chamness | |
| 8,048,326 B2 | 11/2011 | Yue et al. | |
| 8,173,451 B1 | 5/2012 | Tian et al. | |
| 8,415,884 B2 | 4/2013 | Chen | |
| 2008/0186473 A1* | 8/2008 | Lee | H01L 22/26 356/72 |
| 2012/0085494 A1* | 4/2012 | Uchida | H01J 37/32963 156/345.25 |

OTHER PUBLICATIONS

White, Goodlin, Gower, Boning, Chen, Sawin, Dalton, "Low-Open Area Endpoint Detection using a PCA based T2 Statistic and Q Statistic on Optical Emission Spectroscopy Measurements", IEEE Transactions on Semiconductor Manufacturing, vol. 13, Issue: 2, May 2000, pp. 193-207.

Brian E. Goodlin, Duane S. Boning, Herbert H. Sawin, "Quantitative Analysis and Comparison of Endpoint Detection Based on Multiple Wavelength Analysis", 201st Meeting of the Electrochemical Society, International Symposium on Plasma Processing XIV, Abs. 415, Philadelphia, PA, May 2002.

PCT International Search Report issued in counterpart PCT application PCT/US2013/065378, on Mar. 19, 2014.

David Allan White, "Multivariate Analysis of Spectral Measurement for the Characterization of Semiconductor Prosesses", Dissertation presented Aug. 31, 2001, at Massachusetts Institute of Technology.

Brian E. Goodlin, "Multivariate Endpoint Detection of Plasma Etching Processes", Dissertation presented Apr. 2002, at Massachusetts Institute of Technology.

Taiwanese Patent Application No. 102137525, "Notification of Examination Opinions," dated May 25, 2015, filed Oct. 17, 2013.

* cited by examiner

METHOD OF ENDPOINT DETECTION OF PLASMA ETCHING PROCESS USING MULTIVARIATE ANALYSIS

CROSS REFERENCE TO RELATED APPLICATIONS

This application is based on and claims the benefit of and priority to U.S. Provisional Patent Application No. 61/715,047, entitled "METHOD OF ENDPOINT DETECTION OF PLASMA ETCHING PROCESS USING MULTIVARIATE ANALYSIS", filed on Oct. 17, 2012, the entire contents of which are herein incorporated by reference.

BACKGROUND OF THE INVENTION

1. Field of the Invention

The present invention relates to a method and system for controlling the process of etching a structure on a substrate, for example, in semiconductor manufacturing. More particularly, it relates to a method for determining an endpoint of an etch process.

2. Description of Related Art

Plasma etch processes are commonly used in conjunction with photolithography in the process of manufacturing semiconductor devices, liquid crystal displays (LCDs), light-emitting diodes (LEDs), and some photovoltaics (PVs). Generally, a layer of radiation-sensitive material, such as photoresist, is first coated on a substrate and exposed to patterned light to impart a latent image thereto. Thereafter, the exposed radiation-sensitive material is developed to remove exposed radiation-sensitive material (or unexposed, if negative tone photoresist is used), leaving a pattern of radiation-sensitive material which exposes areas to be subsequently etched, and covers areas where no etching is desired. During the etch process, for example a plasma etch process, the substrate and radiation-sensitive material pattern are exposed to energetic ions in a plasma processing chamber, so as to effect removal of the material underlying the radiation-sensitive material in order to form etched features, such as vias, trenches, etc. Following etching of the features in the underlying material, the remainder of the radiation-sensitive material is removed from the substrate using an ashing or stripping process, to expose formed etched structures ready for further processing.

In many types of devices, such as semiconductor devices, the plasma etch process is performed in a first material layer overlying a second material layer, and it is important that the etch process be stopped accurately once the etch process has formed an opening or pattern in the first material layer, without continuing to etch the underlying second material layer.

For purposes of controlling the etch process various types of endpoint control are utilized, some of which rely on analyzing the chemistry of the gas in the plasma processing chamber in order to deduce whether the etch process has progressed, for example, to an underlying layer of a different chemical composition than the chemical composition of the layer being etched. Other processes may rely on direct in-situ measurements made of structures being etched. In the former group, optical emission spectroscopy (OES) is frequently used to monitor the chemistry of the gas in the plasma processing chamber. The chemical species of the gas in the plasma processing chamber are excited by the plasma excitation mechanism being used, and the excited chemical species produce distinct spectral signatures in the optical emission spectrum of the plasma. Changes in the optical emission spectrum due to, for example, clearing of a layer being etched, and exposing of an underlying layer on the substrate, can be monitored and used to precisely end, i.e. endpoint the etch process, so as to avoid etching of the underlying layer or formation of other yield defeating defects, such as undercuts, etc.

Depending on the types of structures being etched and the etch process parameters, the change of the optical emission spectrum of the plasma at the endpoint of the etch process may be very pronounced and easy to detect, or conversely subtle and very difficult to detect. For example, etching of structures with a very low open ratio can make endpoint detection difficult using current algorithms for processing optical emission spectroscopy (OES) data. Improvements are therefore needed to make etch endpoint detection based on optical emission spectroscopy (OES) data more robust in such challenging etch process conditions.

SUMMARY OF THE INVENTION

An aspect of the invention is a method for determining etch process endpoint data comprising performing one or more plasma etch process runs in a plasma etch processing tool comprising a spectrometer for acquiring optical emission spectroscopy (OES) data. During each of the plasma etch process runs, optical emission spectroscopy (OES) data sets are sampled at equal time intervals, and optical emission spectroscopy (OES) data matrices [X] are formed with time samples occupying rows and pixel locations (i.e. wavelengths) occupying columns.

In another aspect of the invention, the acquired optical emission spectroscopy data matrices [X] are then averaged element by element to form an average optical emission spectroscopy (OES) data matrix $[X]^{avg}$ for the one or more plasma etch process runs. Thereafter, the average optical emission spectroscopy (OES) data matrix $[X]^{avg}$ can be filtered to remove noise from the optical emission spectroscopy (OES) data. To improve data quality for further processing, each of the optical emission spectroscopy (OES) data matrices [X] and the average optical emission spectroscopy (OES) data matrix $[X]^{avg}$ are truncated to remove any portions of the data sets corresponding to plasma startup conditions and any conditions following endpoint of the etch processes. Computations further proceed by calculating a mean optical emission spectroscopy (OES) data matrix $[S_{avg}]$, in which each element of each column represents an average of spectrometer pixel intensities over all time samples retained after truncation, for that spectrometer pixel, i.e. matrix column. The mean optical emission spectroscopy (OES) data matrix $[S^{avg}]$ is then subtracted from each of the optical emission spectroscopy (OES) data matrices [X]. The optical emission spectroscopy (OES) data is, therefore, de-meaned. However, unlike what is usually done in multivariate analysis, the optical emission spectroscopy (OES) data is not normalized prior to being used as input for multivariate analysis.

In a further aspect of the invention, the de-meaned and non-normalized optical emission spectroscopy (OES) data are now used as an input for a principal components analysis (PCA), which transforms the physical optical emission spectroscopy (OES) data into a transformed optical emission spectroscopy (OES) data vector [T]. It also provides a principal component weights vector [P] which can be used to subsequently transform any physical optical emission spectroscopy (OES) data into the principal components domain.

In yet another aspect of the invention, to reliably determine an endpoint of an etch process, the elements of the transformed optical emission spectroscopy (OES) data vector [T] can be combined into a functional form $f(T_i)$, also called a trend variable, which particularly emphasizes the changes that occur to the transformed optical emission spectroscopy (OES) data vector [T] elements during the time when the etch process reaches an endpoint. In one embodiment, the trend variable $f(T_i)$ may simply comprise a single element of the transformed optical emission spectroscopy (OES) data vector [T]. In other embodiments, the trend variable $f(Ti)$ may include a ratio of two elements of the transformed optical emission spectroscopy (OES) data vector [T]. The ratio itself may be raised to an integer or non-integer power. For a further increase of endpoint detection reliability, the elements of the transformed optical emission spectroscopy (OES) data vector [T] can be shifted by subtracting a minimum value, or multiple of the minimum value of each element of the transformed optical emission spectroscopy (OES) data vector [T] evaluated for all sample times during an etch process. This shifting, or removal of a "pedestal" from the elements of the transformed optical emission spectroscopy (OES) data vector [T] further assists in rendering the method more sensitive to subtle changes of plasma chemistry associated with certain etch processes. In one embodiment, the functional form of the trend variable may be $f(T_i)=(T_2-2\min(T_2))^2/(T_3-2\min(T_3))^2$, involving the square of the ratio of elements $T_2$ and $T_3$ of the transformed optical emission spectroscopy (OES) data vector [T], each element being shifted by twice the minimum value of each of the respective elements.

In a further aspect of the invention, the values of the principal component weights vector [P], the mean optical emission spectroscopy (OES) data matrix $[S_{avg}]$, and optionally the minimum values $\min(T_i)$ of the elements of the transformed optical emission spectroscopy (OES) data vector [T] can be saved on volatile or non-volatile data storage media for use in in-situ endpoint detection of nominally same or similar etch processes.

In an aspect of the invention, the process of in-situ endpoint detection of an etch process proceeds by retrieving previously stored values of the principal component weights vector [P], the mean optical emission spectroscopy (OES) data matrix $[S^{avg}]$, and optionally the minimum values $\min(T_i)$ of the elements of the transformed optical emission spectroscopy (OES) data vector [T], from the data storage media. Upon loading of a substrate into the plasma etch processing chamber, and initiating a plasma, measurements of optical emission spectroscopy (OES) data are taken using the spectrometer mounted on the plasma etch processing tool at regular or irregular intervals during the etch process. Acquired optical emission spectroscopy (OES) data are multiplied by the principal component weights vector [P] after having the mean optical emission spectroscopy (OES) data matrix $[S^{avg}]$ subtracted, for rapid transformation of in-situ acquired data into the principal components domain. Once transformed, the calculated elements of the transformed optical emission spectroscopy (OES) data vector [T] can be combined in a preselected functional form $f(T_i)$, or trend variable, as described before, whose evolution in time allows a precise in-situ determination of an endpoint of the etch process. In an embodiment, the functional form $f(T_i)$, or the trend variable, may involve the use of shifted values of the elements of the transformed optical emission spectroscopy (OES) data vector [T], the shifting of which is accomplished by subtracting the minimum values $\min(T_i)$ of the elements of the transformed optical emission spectroscopy (OES) data vector [T].

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF EXEMPLARY EMBODIMENTS

In the following description, in order to facilitate a thorough understanding of the invention and for purposes of explanation and not limitation, specific details are set forth, such as particular geometries of a lithography, coater/developer, and gap-fill treatment system, and descriptions of various components and processes. However, it should be understood that the invention may be practiced in other embodiments that depart from these specific details.

In the description to follow, the terms radiation-sensitive material and photoresist may be used interchangeably, photoresist being only one of many suitable radiation-sensitive materials for use in photolithography. Similarly, hereinafter the term substrate, which represents the workpiece being processed, may be used interchangeably with terms such as semiconductor wafer, LCD panel, light-emitting diode (LED), photovoltaic (PV) device panel, etc., the processing of all of which falls within the scope of the claimed invention.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 1:
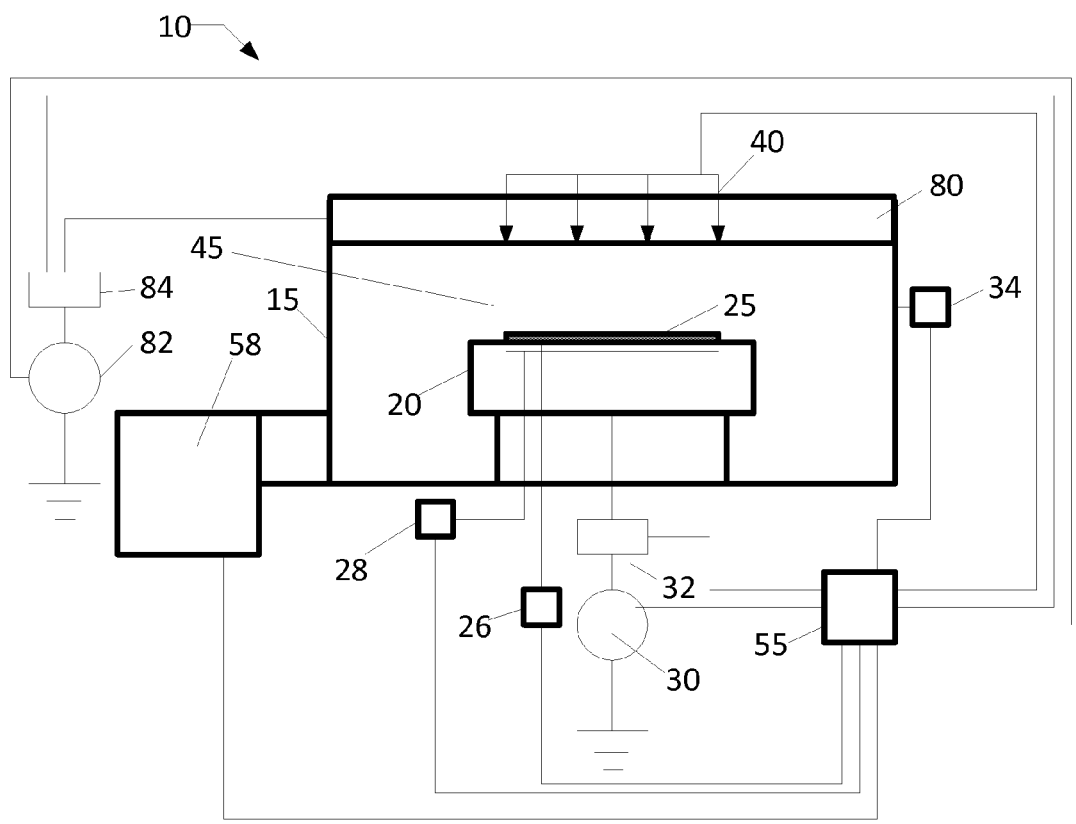
FIG. 1 is a schematic of an exemplary plasma etch processing system with a light detection device including a spectrometer used for acquisition of optical emission spectroscopy (OES) data, and a controller implementing the etch endpoint detection method described herein.

According to an embodiment of the present invention, depicted in FIG. 1 is a plasma etch processing system 10 and a controller 55, wherein the controller 55 is coupled to plasma etch processing system 10. Controller 55 is configured to monitor the performance of plasma etch processing system

10 using data obtained from a variety of sensors disposed in the plasma etch processing system 10. For example, controller 55 can be used to control various components of plasma etch processing system 10, to detect faults, and to detect an endpoint of an etch process.

According to the illustrated embodiment of the present invention depicted in FIG. 1, the plasma etch processing system 10 includes a process chamber 15, substrate holder 20, upon which a substrate 25 to be processed is affixed, gas injection system 40, and vacuum pumping system 58. Substrate 25 can be, for example, a semiconductor substrate, a wafer, or a liquid crystal display (LCD). The plasma etch processing system 10 can be, for example, configured to facilitate the generation of plasma in processing region 45 adjacent a surface of substrate 25, where plasma is formed via collisions between heated electrons and an ionizable gas. An ionizable gas or mixture of gases is introduced via gas injection system 40, and the process pressure is adjusted. Desirably, plasma is utilized to create materials specific to a predetermined materials process, and to aid the removal of material from the exposed surfaces of substrate 25. For example, controller 55 can be used to control vacuum pumping system 58 and gas injection system 40.

Substrate 25 can be, for example, transferred into and out of plasma etch processing system 10 through a slot valve (not shown) and chamber feed-through (not shown) via robotic substrate transfer system where it is received by substrate lift pins (not shown) housed within substrate holder 20 and mechanically translated by devices housed therein. Once substrate 25 is received from substrate transfer system, it is lowered to an upper surface of substrate holder 20.

For example, substrate 25 can be affixed to the substrate holder 20 via an electrostatic clamping system 28. Furthermore, substrate holder 20 can further include a cooling system including a re-circulating coolant flow that receives heat from substrate holder 20 and transfers heat to a heat exchanger system (not shown), or when heating, transfers heat from the heat exchanger system. Moreover, gas can be delivered to the back-side of the substrate via a backside gas delivery system 26 to improve the gas-gap thermal conductance between substrate 25 and substrate holder 20. Such a system can be utilized when temperature control of the substrate is required at elevated or reduced temperatures. For example, temperature control of the substrate can be useful at temperatures in excess of the steady-state temperature achieved due to a balance of the heat flux delivered to the substrate 25 from the plasma and the heat flux removed from substrate 25 by conduction to the substrate holder 20. In other embodiments, heating elements, such as resistive heating elements, or thermo-electric heaters/coolers can be included.

With continuing reference to FIG. 1, process gas can be, for example, introduced to processing region 45 through gas injection system 40. Process gas can, for example, include a mixture of gases such as argon, $CF_4$ and $O_2$, or Ar, $C_4F_8$ and $O_2$ for oxide etch applications, or other chemistries such as, for example, $O_2/CO/Ar/C_4F_8$, $O_2/CO/Ar/C_5F_8$, $O_2/CO/Ar/C_4F_6$, $O_2/Ar/C_4F_6$, $N_2/H_2$. Gas injection system 40 includes a showerhead, where process gas is supplied from a gas delivery system (not shown) to the processing region 45 through a gas injection plenum (not shown) and a multi-orifice showerhead gas injection plate (not shown).

Vacuum pumping system 58 can, for example, include a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP is generally employed. TMPs are useful for low pressure processing, typically less than 50 mTorr. At higher pressures, the TMP pumping speed falls off dramatically. For high pressure processing (i.e., greater than 100 mTorr), a mechanical booster pump and dry roughing pump can be used. Furthermore, a device for monitoring chamber pressure (not shown) is coupled to the process chamber 15. The pressure measuring device can be, for example, a Type 628B Baratron absolute capacitance manometer commercially available from MKS Instruments, Inc. (Andover, Mass.).

As further shown in FIG. 4, the plasma etch processing system 10, includes a plasma source 80. For example, RF or microwave power can be coupled from generator 72 through impedance match network or tuner 74 to the plasma source 80. A frequency for the application of RF power to the plasma source ranges from 10 MHz to 200 MHz and is preferably 60 MHz, for capacitively-coupled (CCP), inductively-coupled (ICP), and transformer-coupled (TCP) plasma sources. For microwave plasma sources 80, such as electron cyclotron (ECR) and surface wave plasma (SWP) sources, typical frequencies of operation of generator 72 are between 1 and 5 GHz, and preferably about 2.45 GHz. An example of a surface wave plasma (SWP) source 80 is a radial line slotted antenna (RLSA) plasma source. Moreover, controller 55 can be coupled to generator 72 and impedance match network or tuner 74 in order to control the application of RF or microwave power to plasma source 80.

As shown in FIG. 1, substrate holder 20 can be electrically biased at an RF voltage via the transmission of RF power from RF generator 30 through impedance match network 32 to substrate holder 20. The RF bias can serve to attract ions from the plasma formed in processing region 45, to facilitate the etch process. The frequency for the application of power to the substrate holder 20 can range from 0.1 MHz to 30 MHz and is preferably 2 MHz. Alternately, RF power can be applied to the substrate holder 20 at multiple frequencies. Furthermore, impedance match network 32 serves to maximize the transfer of RF power to plasma in process chamber 15 by minimizing the reflected power. Various match network topologies (e.g., L-type, π-type, T-type, etc.) and automatic control methods can be utilized.

Various sensors are configured to receive tool data from plasma etch processing system 10. The sensors can include both sensors that are intrinsic to the plasma etch processing system 10 and sensors extrinsic to the plasma etch processing system 10. Intrinsic sensors can include those sensors pertaining to the functionality of plasma etch processing system 10 such as the measurement of the Helium backside gas pressure, Helium backside flow, electrostatic chuck (ESC) voltage, ESC current, substrate holder 20 temperature (or lower electrode (LEL) temperature), coolant temperature, upper electrode (UEL) temperature, forward RF power, reflected RF power, RF self-induced DC bias, RF peak-to-peak voltage, chamber wall temperature, process gas flow rates, process gas partial pressures, chamber pressure, capacitor settings (i.e., C1 and C2 positions), a focus ring thickness, RF hours, focus ring RF hours, and any statistic thereof. Alternatively, extrinsic sensors can include those not directly related to the functionality of plasma etch processing system 10 such as a light detection device 34 for monitoring the light emitted from the plasma in processing region 45 as shown in FIG. 1.

The light detection device 34 can include a detector such as a (silicon) photodiode or a photomultiplier tube (PMT) for measuring the total light intensity emitted from the plasma. The light detection device 34 can further include an optical filter such as a narrow-band interference filter. In an alternate embodiment, the light detection device 34 includes a line CCD (charge coupled device) or CID (charge injection device) array and a light dispersing device such as a grating or a prism. Additionally, light detection device 34 can include a monochromator (e.g., grating/detector system) for measuring light at a given wavelength, or a spectrometer (e.g., with a rotating or fixed grating) for measuring the light spectrum. The light detection device 34 can include a high resolution optical emission spectroscopy (OES) sensor from Peak Sensor Systems. Such an OES sensor has a broad spectrum that spans the ultraviolet (UV), visible (VIS) and near infrared (NIR) light spectrums. In the Peak Sensor System, the resolution is approximately 1.4 Angstroms, that is, the sensor is capable of collecting 5550 wavelengths from 240 to 1000 nm. In the Peak System Sensor, the sensor is equipped with high sensitivity miniature fiber optic UV-VIS-NIR spectrometers which are, in turn, integrated with 2048 pixel linear CCD arrays.

The spectrometers in one embodiment of the present invention receive light transmitted through single and bundled optical fibers, where the light output from the optical fibers is dispersed across the line CCD array using a fixed grating. Similar to the configuration described above, light emitting through an optical vacuum window is focused onto the input end of the optical fibers via a convex spherical lens. Three spectrometers, each specifically tuned for a given spectral range (UV, VIS and NIR), form a sensor for a process chamber. Each spectrometer includes an independent A/D converter. And lastly, depending upon the sensor utilization, a full emission spectrum can be recorded every 0.01 to 1.0 seconds.

Alternatively, in an embodiment, a spectrometer with all reflective optics may be employed by light detection device 34. Furthermore, in an embodiment, a single spectrometer involving a single grating and a single detector for the entire range of light wavelengths being detected may be used. The design and use of optical emission spectroscopy hardware for acquiring optical emission spectroscopy (OES) data using e.g. light detection device 34, are well known to those skilled in the art of optical plasma diagnostics.

Controller 55 includes a microprocessor, memory, and a digital I/O port (potentially including D/A and/or A/D converters) capable of generating control voltages sufficient to communicate and activate inputs to plasma etch processing system 10 as well as monitor outputs from plasma etch processing system 10. As shown in FIG. 1, controller 55 can be coupled to and exchange information with RF generator 30, impedance match network 32, gas injection system 40, vacuum pumping system 58, backside gas delivery system 26, electrostatic clamping system 28, and light detection device 34. A program stored in the memory is utilized to interact with the aforementioned components of a plasma etch processing system 10 according to a stored process recipe. One example of controller 55 is a DELL PRECISION WORKSTATION 530™, available from Dell Corporation, Austin, Tex. Controller 55 can be locally located relative to the plasma etch processing system 10, or it can be remotely located relative to the plasma etch processing system 10. For example, controller 55 can exchange data with plasma etch processing system 10 using at least one of a direct connection, an intranet, and the internet. Controller 55 can be coupled to an intranet at, for example, a customer site (i.e., a device maker, etc.), or it can be coupled to an intranet at, for example, a vendor site (i.e., an equipment manufacturer). Additionally, for example, controller 55 can be coupled to the internet. Furthermore, another computer (i.e., controller, server, etc.) can, for example, access controller 55 to exchange data via at least one of a direct connection, an intranet, and the internet.

The controller 55 also implements an algorithm for detection of an endpoint of an etch process being performed in plasma etch processing system 10, based on input data provided from light detection device 34, as described further herein.

The process of endpoint determination in accordance with an embodiment of the invention proceeds in two phases. In the first phase, optical emission spectroscopy (OES) data are acquired using light detection device 34 during one or more etch processing runs performed in a plasma etch processing system 10, such that a multivariate model can be established of the acquired optical emission spectroscopy (OES) data. Once the multivariate model of the optical emission spectroscopy (OES) data has been established, it can be used in a second phase for in-situ etch endpoint detection, as long as the etch process being run during the second phase is reasonably similar in terms of structures being etched, etch process conditions, etch processing system used, etc., to those used in the one or more etch processing runs performed in the first phase. This is to ensure the validity of multivariate model.

Figure 2:
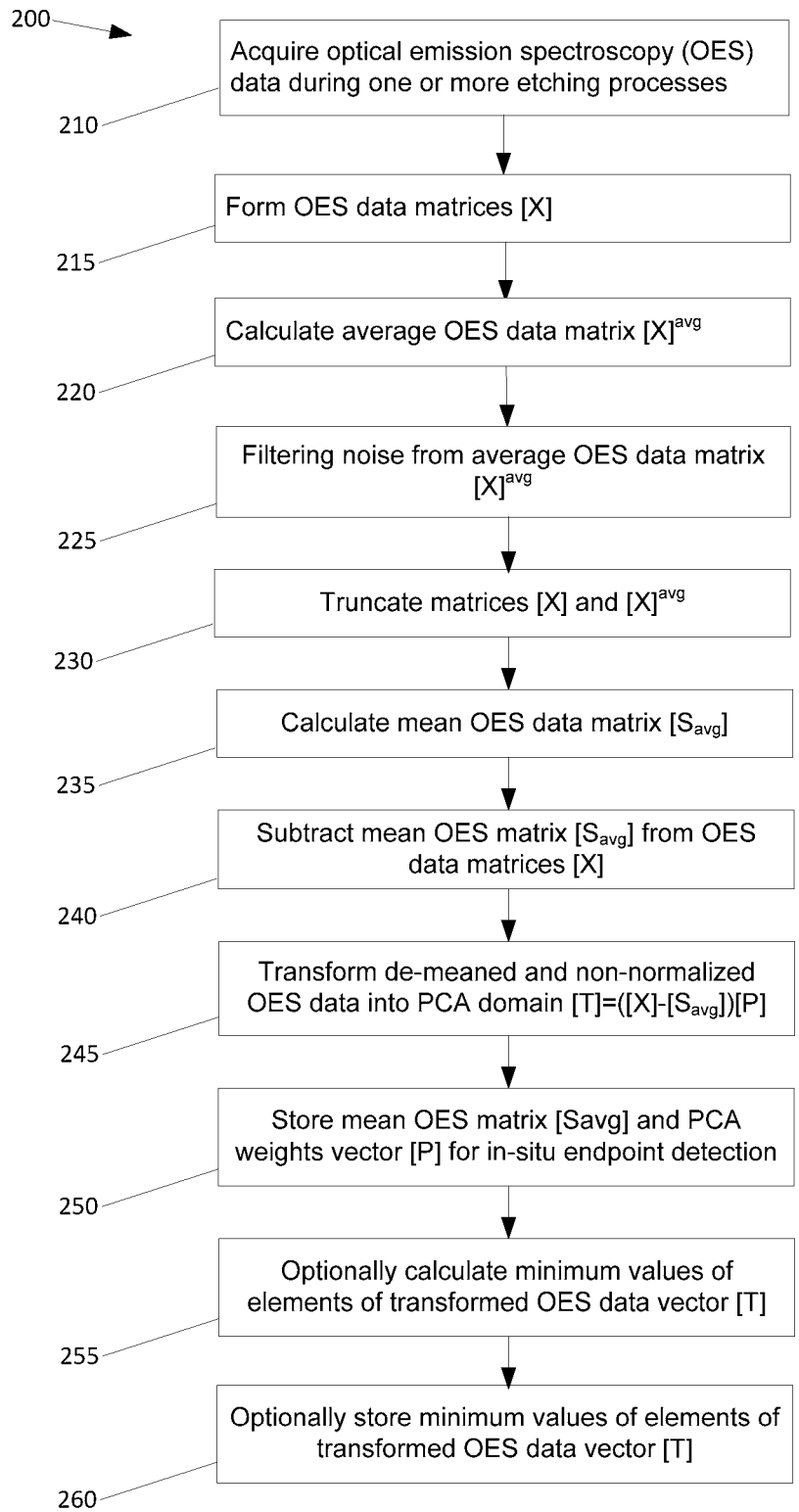
FIG. 2 is a flowchart of the method of preparing etch endpoint data for later in-situ etch endpoint detection.

With reference now to FIG. 2, where a flowchart 200 of the first phase is shown, the process of setting up a multivariate model of the optical emission spectroscopy (OES) data begins at step 210 by performing a set of one or more plasma etch process runs. As mentioned before, the etch process conditions during these runs need to be reasonably close to the etch processes whose endpoint will be determined in the second phase, for the validity of the multivariate model to be maintained. During these plasma etch process runs, optical emission spectroscopy (OES) data is acquired using, for example, light detection device 34 of plasma etch processing system 10. During each plasma etch process run, spectra are acquired n times, where n is an integer greater than 1. The sampling interval between successive optical emission spectroscopy (OES) data acquisitions, i.e. spectra acquisitions, may vary from 0.01 to 1.0 seconds. Each acquired optical emission spectroscopy (OES) data set, i.e. spectrum, contains m measured light intensities corresponding to the m pixels of a CCD (charge coupled device) detector, each pixel corresponding to a certain light wavelength projected upon the pixel by a diffraction grating which is typically employed as a light dispersion device in light detection device 34. CCD detectors may have from 256 to 8192 pixels, depending on the desired spectral resolution, but pixel numbers of 2048 or 4096 are most commonly used.

The process continues in step 215 where optical emission spectroscopy (OES) data matrices $[X]^{[i]}$ are set up for all plasma etch process runs i=1, 2, . . . k. Each matrix $[X]^{[i]}$ is a n×m matrix, where acquired spectra are arranged in rows of the matrix, such that the rows correspond to n instants in time when optical emission spectroscopy (OES) data are taken, and columns correspond to the pixel number m.

In step 220, an n×m average optical emission spectroscopy (OES) data matrix $[X^{avg}]$ is calculated by averaging each element of all acquired matrices $[X]^{[i]}$ over all i=1, 2, . . . k plasma etch process runs.

In step 225, noise is filtered from the average optical emission spectroscopy (OES) data matrix $[X^{avg}]$. Various types of filters can be used, such as, for example, the moving average filter. Furthermore, different parameters may be chosen by the operator for the chosen filter, depending on the amount of noise encountered in the data, which may correlate to a plasma etch processing system being used, structures being etched, the etch process conditions being used, etc. For example, in the case of the moving average filter, the filter window may be adjusted to the most appropriate width so noise is effectively removed; yet important signal data is retained. The inventors have discovered that better results can be obtained by filtering the data at this stage, rather than after constructing a multivariate model of the acquired optical emission spectroscopy (OES) data, as is customarily done in prior art optical emission spectroscopy (OES) etch endpoint systems.

In step 230, all acquired optical emission spectroscopy (OES) data matrices $[X]^{[i]}$ are truncated to remove spectra acquired during plasma startup and optionally following actual etch process endpoint. By truncating the data, matrices $[X]^{[i]}$ are cleaned of any data that does not pertain to the stable period of etching ensuing once the plasma has stabilized in the plasma etch processing system 10. Since measurements made at certain instants of time are truncated, rows of matrices $[X]^{[i]}$ are typically removed. Optionally, certain wavelength ranges can also be truncated if the plasma emission wavelengths in the truncated portions of the spectra do not contribute to the etch endpoint signal. At this time, the average optical emission spectroscopy (OES) data matrix $[X^{avg}]$ may also be truncated in the same fashion as matrices $[X]^{[i]}$.

In step 235, a mean optical emission spectroscopy (OES) data matrix $[S^{avg}]$ is computed, wherein all elements of each column are set to the average across the entire column (i.e. across all instants in time) of the elements of the average optical emission spectroscopy (OES) data matrix $[X^{avg}]$. This matrix $[S^{avg}]$ is used for de-meaning of all optical emission spectroscopy (OES) data.

In step 240, the mean optical emission spectroscopy (OES) data matrix $[S^{avg}]$ is subtracted from each acquired optical emission spectroscopy (OES) data matrix $[X]^{[i]}$, i=1, 2, ... k, to perform the step of de-meaning, i.e. average subtraction, prior to constructing a multivariate model of the acquired optical emission spectroscopy (OES) data. In prior art optical emission spectroscopy (OES) etch endpoint systems, beside de-meaning, the optical emission spectroscopy (OES) data is also always normalized using, for example, the standard deviation of the optical emission spectroscopy (OES) data. However, just like in the case of data filtering, as previously discussed, inventors have discovered that normalization, as done in the prior art, leads to less reliable endpoint detection, particularly under challenging detection conditions. Therefore, the data are kept non-normalized.

In step 245, the de-meaned optical emission spectroscopy (OES) data $[X]^{[i]}-[S^{avg}]$ are used as input into a multivariate analysis, such as for example, principal components analysis (PCA). A principal components (PC) model $$[T]=([X]^{[i]}-[S^{avg}])[P] \quad (Eq. 1)$$

is set up, wherein the vector [T] represents the transformed optical emission spectroscopy (OES) data vector. The vector T has elements Ti, called principal components, which represent a reduced set of variables with which the input data, in this case optical emission spectroscopy (OES) data, can be described. The vector [P] is a vector of principal components (PC) weights, which can be used to transform de-meaned optical emission spectroscopy (OES) data into a transformed optical emission spectroscopy (OES) data vector [T], in accordance with Eq. 1. The methods of setting up and creating a principal components analysis (PCA) model are well known to persons skilled in the art.

Since the goal of the first phase is to pre-calculate useful multivariate model parameters for later in-situ etch endpoint detection, various parameters are now saved for later use. In step 250, the mean optical emission spectroscopy (OES) data matrix $[S^{avg}]$ is saved to volatile or non-volatile storage media, to facilitate de-meaning of in-situ measured optical emission spectroscopy (OES) data. Also in this step, the vector [P] of principal components (PC) weights is saved to volatile or non-volatile storage media to facilitate rapid transformation of in-situ measured optical emission spectroscopy (OES) data into a transformed optical emission spectroscopy (OES) data vector [T].

In some case, inventors have discovered that it is useful for endpoint detection reliability to shift the calculated values of elements $T_i$ of the transformed optical emission spectroscopy (OES) data vector [T], i.e. the principal components, as they evolve over time, such that they concentrate around the value of zero, rather than grow to large positive or negative values. This shifting is accomplished in step 255, where at least one element $T_i$ of the transformed optical emission spectroscopy (OES) data vector [T] is evaluated for each instant in time during the etch process when measurements were taken, and a minimum value of such element, or elements, $min(T_i)$, are found. For this purpose, time-evolving data from the average optical emission spectroscopy (OES) data matrix $[X^{avg}]$, or other data, may be used. This minimum value is then stored in step 260 on volatile or non-volatile storage media for later use in in-situ endpoint detection, whereby the minimum value $min(T_i)$ of an element $T_i$ of the transformed optical emission spectroscopy (OES) data vector [T] can be used to shift the time-evolving values of the same element $T_i$ of the transformed optical emission spectroscopy (OES) data vector [T], calculated from in-situ measured optical emission spectroscopy (OES) data.

The stored data values on volatile or non-volatile storage media are now ready to be used in the second phase, i.e. in in-situ etch endpoint detection. The entire process outlined in flowchart 200 of FIG. 2 can be executed in controller 55 of plasma etch processing system 10 of FIG. 1.

Figure 3:
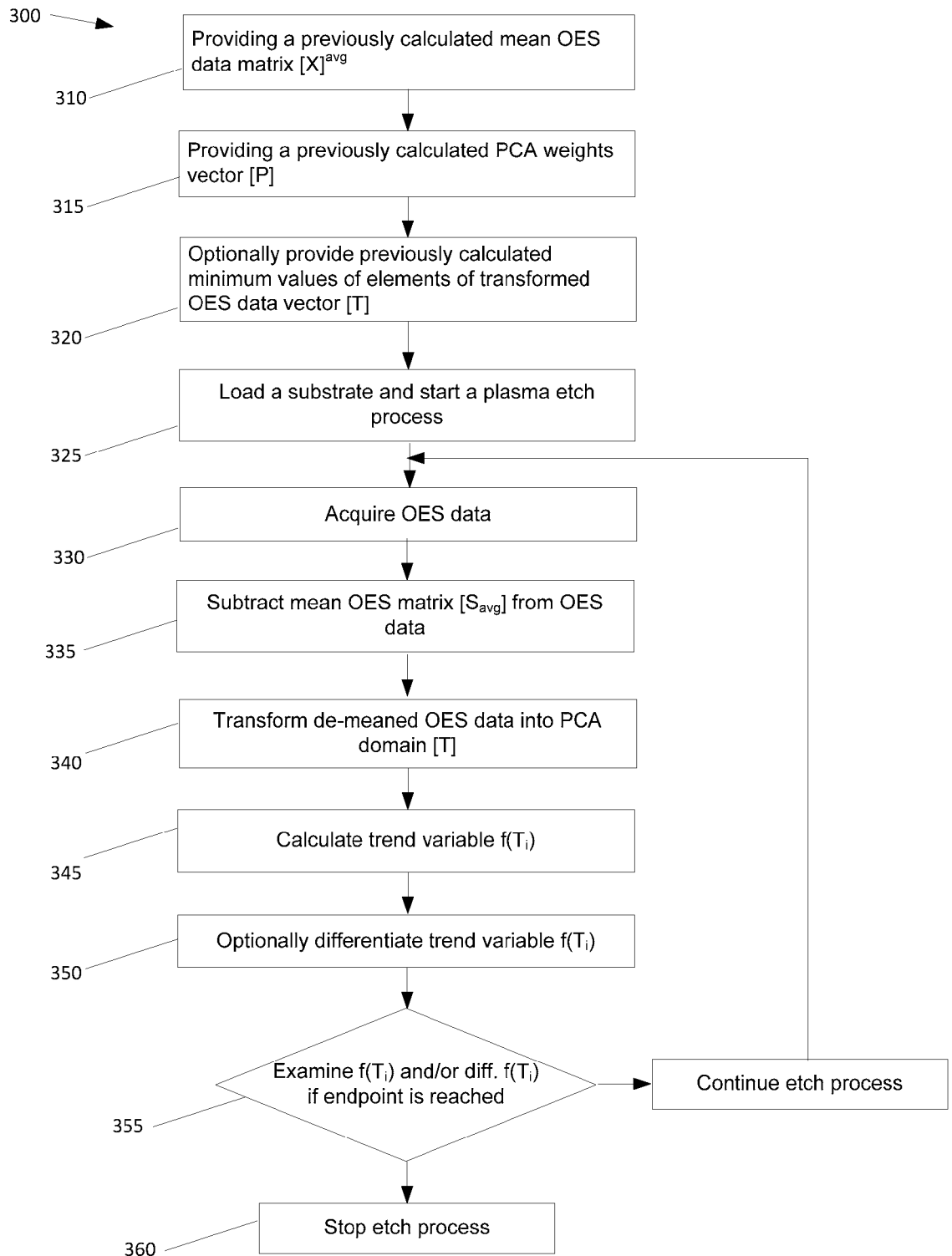
FIG. 3 is a flowchart of the method of in-situ etch endpoint detection.

FIG. 3 shows a flowchart 300 of the process of in-situ endpoint detection in a plasma etch processing system 100, equipped with light detection device 34, having available the data saved in steps 250 and 260 of flowchart 200.

In steps 310 and 315, the previously determined mean optical emission spectroscopy (OES) data matrix $[S^{avg}]$ and the vector [P] of principal components (PC) weights are retrieved from volatile or non-volatile storage media and loaded into memory of controller 55 of plasma etch processing system 10 of FIG. 1. Controller 55 will perform all the in-situ calculations needed to determine endpoint of a plasma process. Also, if used, at least one minimum value $min(T_i)$ of an element $T_i$ of the transformed optical emission spectroscopy (OES) data vector [T] can be loaded from volatile or non-volatile media into memory of controller 55, in step 320.

In step 325, a substrate 25 is loaded into plasma etch processing system 10 and a plasma is formed in processing region 45.

In step 330, light detection device 34 is now used to acquire optical emission spectroscopy (OES) data in-situ, i.e. during the etch process evolving over time.

In step 335, the retrieved mean optical emission spectroscopy (OES) data matrix $[S^{avg}]$ elements are subtracted from each acquired optical emission spectroscopy (OES) data set, i.e. spectrum, to de-mean the acquired spectra prior to transformation using the already developed multivariate model. As was previously mentioned, inventors have discovered that the endpoint detection process is more robust if normalization of data prior to transformation is not done, so hence it is not done at this step, just as it was not done during the first phase.

In step 340, the already developed the principal components analysis (PCA) multivariate model is used to transform the de-meaned optical emission spectroscopy (OES) data into a transformed optical emission spectroscopy (OES) data vector [T], i.e. the principal components, using Eq. 1 and the retrieved vector [P] of principal components (PC) weights.

This process is very fast because it involves only a simple multiplication, and is thus amenable to in-situ real-time calculation. The computed elements $T_i$ of transformed optical emission spectroscopy (OES) data vector [T], as they evolve over time, can be used for endpoint detection.

Figure 4A:
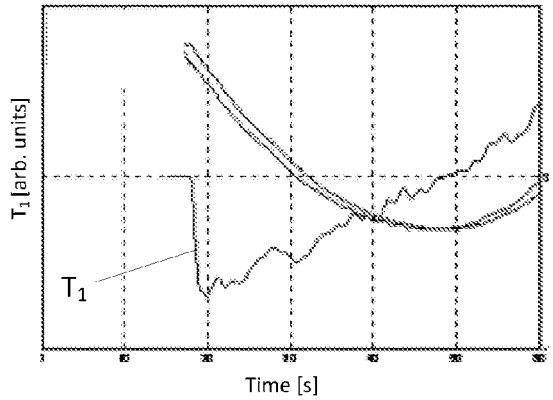
FIGS. 4A-D shows exemplary graphs of the time evolution of the first four elements of a transformed optical emission spectroscopy (OES) data vector [T].
Figure 4B:
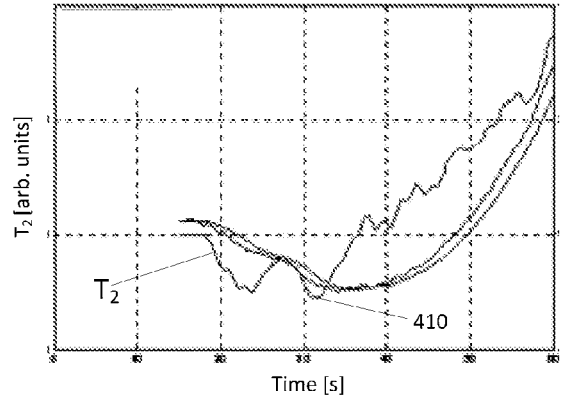
Figure 4C:
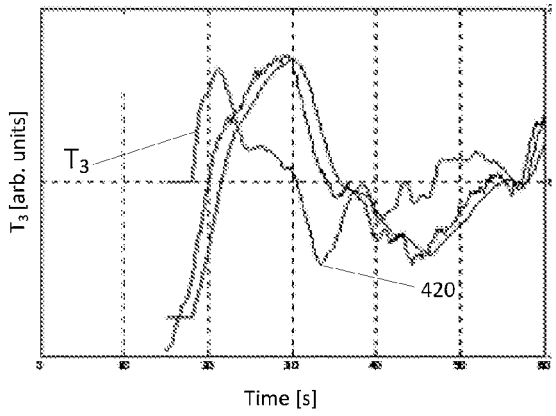
Figure 4D:
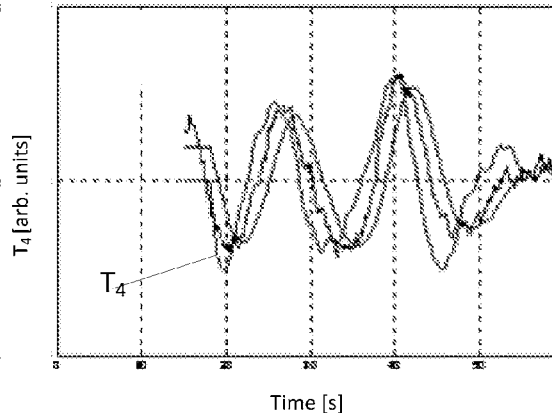

FIGS. 4A-D show time evolution of elements $T_1$ through $T_4$ of the transformed optical emission spectroscopy (OES) data vector [T], i.e. the first four principal components, for an etch process in which the open ratio has a low value of 0.06%—a very challenging condition for endpoint detection using optical emission spectroscopy (OES). From FIG. 4A, one can see that the first principal component $T_1$, despite carrying statistically most information about the optical emission spectroscopy (OES) data, does not show a discernible change in the vicinity of the etch endpoint (located at slightly more than 30 seconds, in all graphs). FIG. 4B shows that second principal component $T_2$ does show a discernible minimum, or dip 410, at the endpoint, but that dip 410 is comparable to other minima in the time evolution of $T_2$, so principal component $T_2$ is not very useful for endpoint detection, either, under these conditions. FIG. 4C shows that the third principal component $T_3$ does show a marginally useful minimum or dip 420 at the etch endpoint, and this can be used for endpoint detection, but it is questionable whether it alone can be used reliably for endpoint detection in case where data is noisier than shown here. Lastly, FIG. 4D shows the fourth principal component $T_4$, which like principal component $T_2$ is not a reliable indicator of endpoint, due to the minimum at endpoint being comparable to other minima. Most prior art optical emission spectroscopy (OES) etch endpoint systems utilize a single principal component $T_i$ for endpoint detection.

From the foregoing, it can be seen that a need exists for further improvement of endpoint detection using time-evolving values of elements $T_i$ of the transformed optical emission spectroscopy (OES) data vector [T]. The inventors have discovered that by combining multiple principal components into a functional form $f(T_i)$ can lead to better and more reliable endpoint detection. Specifically, the inventors have discovered that the time-evolving functional form involving shifted principal components (using twice the minimum value of a principal component as a shifting distance), i.e.

$$f(Ti)=(T_2-2\cdot\min(T_2))^2/(T_3-2\cdot\min(T_3))^2 \tag{Eq. 2}$$

can be particularly useful for etch endpoint detection when etch conditions such as those in FIGS. 4A-D are used, i.e. low open ratio structures are etched. The time-evolving signal $f(T_i)$ involving multiple principal components $T_i$ will be hereinafter referred to as a trend variable. Examination of Eq. 2. shows that the trend variable f(Ti) can be readily and efficiently evaluated in-situ, in real time, once principal components $T_i$ are computed, further utilizing retrieved minimum values $\min(T_i)$ of elements $T_i$ of the transformed optical emission spectroscopy (OES) data vector [T]. This computation occurs in step 345 of flowchart 300.

In step 350, each time-evolving element $T_i$ of the transformed optical emission spectroscopy (OES) data vector [T] can be differentiated to further facilitate endpoint detection using trend variable slope data.

Figure 5:
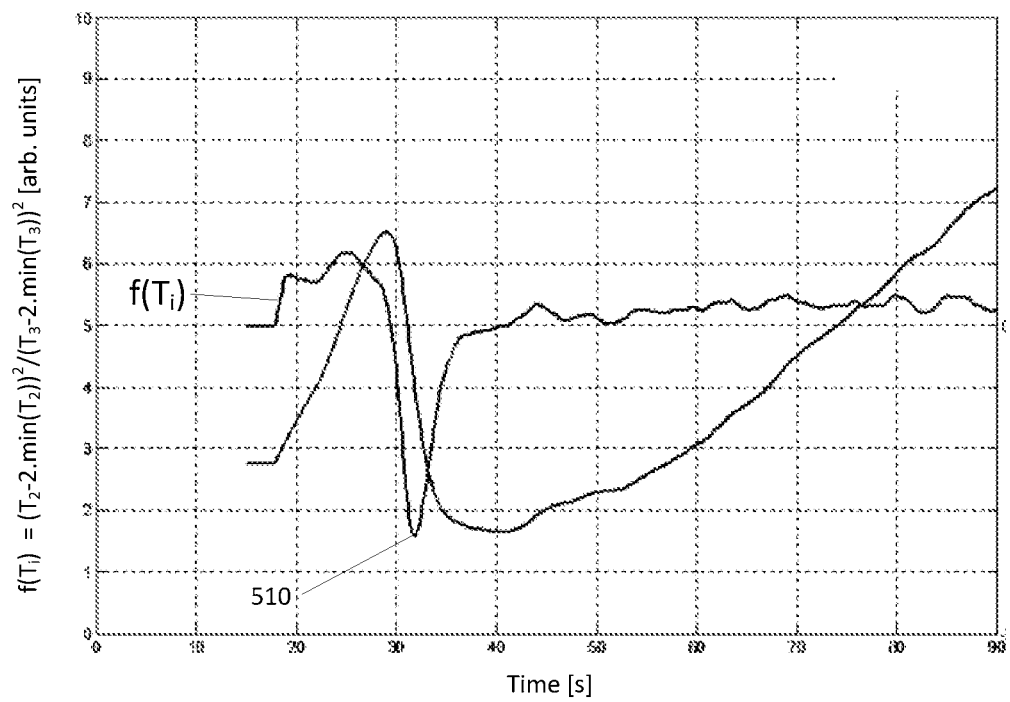
FIG. 5 shows an exemplary graph of a time evolution of a trend variable functional form involving a ratio of shifted elements of the transformed optical emission spectroscopy (OES) data vector [T].

FIG. 5 shows a time evolution of trend variable $f(T_i)$ of Eq. 2 for the same etch process in which principal components $T_1$ through $T_4$ of FIGS. 4A-D were obtained. It is very clear from the graph that the functional form $f(T_i)$ of Eq. 2 is preferred over single principal components $T_i$ because of the deep, and thus easily identified minimum 510 that the differentiated trend variable $f(T_i)$ goes through at etch endpoint.

Inventors have also discovered that other functional forms of the trend variable $f(T_i)$ may be successfully used in less challenging conditions, e.g. $T_2/T_3$, $(T_2/T_3)^2$, $(T_2-2\cdot\min(T_2))/(T_3-2\cdot\min(T_3))$, etc. Most of these functional forms involve a ratio of principal components, as opposed to the use of principal components alone, as is done in the prior art, and may employ varying shifting distances to bring the principal component values close to zero, so the values of ratios of principal components can be increased for easy endpoint detection.

Now that the time-evolving trend variable $f(T_i)$ has been calculated, controller 55 of plasma etch processing system 10 needs to make a decision, in step 355, whether endpoint has been reached. If indeed it has been reached, the etch process is ended at step 360, otherwise the etch process is continued, and continuously monitored for etch endpoint via steps 330-355 of flowchart 300.

Persons skilled in the relevant art can appreciate that many modifications and variations are possible in light of the above teaching. Persons skilled in the art will recognize various equivalent combinations and substitutions for various components shown in the figures. It is therefore intended that the scope of the invention be limited not by this detailed description, but rather by the claims appended hereto.

What is claimed is:

1. A method for determining etch process endpoint data, comprising:

in a plasma etch processing tool, performing k plasma etch process runs, where k is an integer greater than zero, each of the k plasma etch process runs comprising steps of:

loading a substrate to be processed into the plasma etch processing tool, the plasma etch processing tool comprising a spectrometer having a detector comprising m pixels, each pixel corresponding to a different light wavelength;

igniting a plasma in the plasma etch processing tool;

collecting n optical emission spectroscopy (OES) data sets sampled at equal time intervals during each of k plasma etch process runs, each of the n optical emission spectroscopy (OES) data sets comprising m pixel intensities corresponding to m pixels of the spectrometer;

forming an n×m optical emission spectroscopy (OES) data matrix [X] for each of k plasma etch process runs, each time sample occupying a row of the optical emission spectroscopy (OES) data matrix [X], the columns of the optical emission spectroscopy (OES) data matrix [X] corresponding to pixels of the spectrometer;

computing an n×m average optical emission spectroscopy (OES) data matrix $[X]^{avg}$, wherein each element of the average optical emission spectroscopy (OES) data matrix $[X]^{avg}$ is computed as an average of corresponding elements of optical emission spectroscopy (OES) data matrices [X] for the k etch process runs;

filtering noise from the average optical emission spectroscopy (OES) data matrix $[X]^{avg}$;

truncating each optical emission spectroscopy (OES) data matrix [X] to eliminate optical emission spectroscopy (OES) data acquired during plasma startup and for times beyond an etch process endpoint;

truncating the average optical emission spectroscopy (OES) data matrix $[X]^{avg}$ to eliminate averaged optical emission spectroscopy (OES) data acquired during plasma startup and for times beyond the etch process endpoint;

calculating an n×m mean optical emission spectroscopy (OES) data matrix $[S_{avg}]$, wherein each element of the mean optical emission spectroscopy (OES) data matrix $[S_{avg}]$ is computed as an average value of n elements of the corresponding column of the average optical emission spectroscopy (OES) data matrix $[X]^{avg}$;

subtracting the mean optical emission spectroscopy (OES) data matrix $[S_{avg}]$ from optical emission spectroscopy (OES) data matrices [X], to de-mean the optical emission spectroscopy (OES) data, and performing a principal component analysis $[T]=([X]^{[i]}-[S_{avg}])[P]$ on the de-meaned and non-normalized subtraction results, to obtain a transformed optical emission spectroscopy (OES) data vector [T] and principal component weights vector [P];

storing the mean optical emission spectroscopy (OES) data matrix $[S_{avg}]$ for later use in in-situ determination of an etch process endpoint;

storing the principal component weights vector [P] for later use in in-situ determination of the etch process endpoint.

2. The method of claim 1, further comprising:

selecting a functional form $f(T_i)$ involving elements of the transformed optical emission spectroscopy (OES) data vector [T] as a trend variable for in-situ determination of the etch process endpoint.

3. The method of claim 2, wherein the selected functional form $f(T_i)$ of the trend variable is a single element of the transformed optical emission spectroscopy (OES) data vector [T].

4. The method of claim 3, wherein the selected functional form $f(T_i)$ of the trend variable contains a ratio of two elements of the transformed optical emission spectroscopy (OES) data vector [T], wherein twice a minimum value min $(T_i)$ of each of the elements of the transformed optical emission spectroscopy (OES) data vector [T] has been subtracted from the respective elements of the transformed optical emission spectroscopy (OES) data vector [T] prior to computing the ratio.

5. The method of claim 4, wherein the selected functional form $f(T_i)$ of the trend variable involves a second and third element of the transformed optical emission spectroscopy (OES) data vector [T], and is of the form $f(T_i)=(T_2-2\cdot\min(T_2))^2/(T_3-2\cdot\min(T_3))^2$.

6. The method of claim 2, further comprising:

computing a time evolution of at least one element of the transformed optical emission spectroscopy (OES) data vector [T];

determining at least one minimum value $\min(T_i)$ of the transformed optical emission spectroscopy (OES) data vector [T] from the computed time evolution of the at least one element of the transformed optical emission spectroscopy (OES) data vector [T];

storing the at least one determined minimum value $\min(T_i)$ of an element of the transformed optical emission spectroscopy (OES) data vector [T] for later use in in-situ determination of the etch process endpoint.

7. The method of claim 6, wherein the selected functional form $f(T_i)$ of the trend variable is an element of the transformed optical emission spectroscopy (OES) data vector [T] from which the twice the minimum value $\min(T_i)$ of the same element of the transformed optical emission spectroscopy (OES) data vector [T] has been subtracted.

8. The method of claim 2, wherein the selected functional form $f(T_i)$ of the trend variable contains a ratio of two elements of the transformed optical emission spectroscopy (OES) data vector [T].

9. The method of claim 1, wherein the step of filtering noise comprises applying a moving average filter.

10. The method of claim 1, wherein the step of filtering noise comprises applying a filter whose characteristics are specific to the plasma etch processing tool.

* * * * *